United States Patent
McConnell

(10) Patent No.: US 7,671,672 B2
(45) Date of Patent: Mar. 2, 2010

(54) BASEBAND NOISE REDUCTION

(75) Inventor: Richard McConnell, Rancho Cucamonga, CA (US)

(73) Assignee: SiRF Technology, Inc., San Jose, CA (US)

( * ) Notice: Subject to any disclaimer, the term of this patent is extended or adjusted under 35 U.S.C. 154(b) by 38 days.

(21) Appl. No.: 11/615,746

(22) Filed: Dec. 22, 2006

(65) Prior Publication Data

US 2007/0216477 A1    Sep. 20, 2007

Related U.S. Application Data

(60) Provisional application No. 60/753,878, filed on Dec. 22, 2005.

(51) Int. Cl.
 *H03F 1/02* (2006.01)
(52) U.S. Cl. .......................................... 330/9; 327/124
(58) Field of Classification Search ...................... 330/9; 327/124, 307
 See application file for complete search history.

(56) References Cited

U.S. PATENT DOCUMENTS

| | | | |
|---|---|---|---|
| 3,597,696 A * | 8/1971 | Rabindran .................... | 330/10 |
| 4,048,574 A * | 9/1977 | Barbier et al. ................. | 330/9 |
| 6,411,892 B1 | 6/2002 | Van Diggelen | |
| 6,417,801 B1 | 7/2002 | Van Diggelen | |
| 6,429,814 B1 | 8/2002 | Van Diggelen et al. | |
| 6,453,237 B1 | 9/2002 | Fuchs et al. | |
| 6,484,097 B2 | 11/2002 | Fuchs et al. | |
| 6,487,499 B1 | 11/2002 | Fuchs et al. | |
| 6,510,387 B2 | 1/2003 | Van Diggelen | |
| 6,542,820 B2 | 4/2003 | LaMance et al. | |
| 6,560,534 B2 | 5/2003 | Abraham et al. | |
| 6,606,346 B2 | 8/2003 | Abraham et al. | |
| 6,704,651 B2 | 3/2004 | Van Diggelen | |
| 6,911,864 B2 * | 6/2005 | Bakker et al. .................. | 330/9 |
| 7,336,123 B2 * | 2/2008 | Yoshida et al. ................. | 330/9 |
| 2006/0158244 A1 * | 7/2006 | Kejariwal et al. .............. | 330/9 |
| 2007/0146065 A1 * | 6/2007 | Yoshizawa et al. ............. | 330/9 |
| 2008/0106330 A1 * | 5/2008 | Yoshida et al. ................. | 330/10 |
| 2008/0197834 A1 * | 8/2008 | Takeda .................... | 324/123 R |

* cited by examiner

*Primary Examiner*—Henry K Choe
(74) *Attorney, Agent, or Firm*—Thomas, Kayden, Horstemeyer & Risley, LLP

(57) ABSTRACT

An active circuit includes (a) a first chopper circuit that receives an input signal and a chopping signal of a frequency higher than a base band of the input signal, and that provides a modulated input signal; (b) an amplifier that receives the modulated input signal and that provides an amplified signal resulting from amplifying the modulated input signal; and (c) a second chopper circuit that receives the amplified signal and the chopping signal to provide an output signal. The chopping signal has a frequency that may be dynamically adjusted to accommodate changes in impedance and signal spectrum as a result of the operations of the chopper circuits. The active circuit further includes a low pass filter that receives the output signal and that attenuates components of the output signal above the base band of the input signal. In this manner 1/f noise introduced by the amplifier is eliminated or reduced.

17 Claims, 3 Drawing Sheets

Principle of chopper amplifier

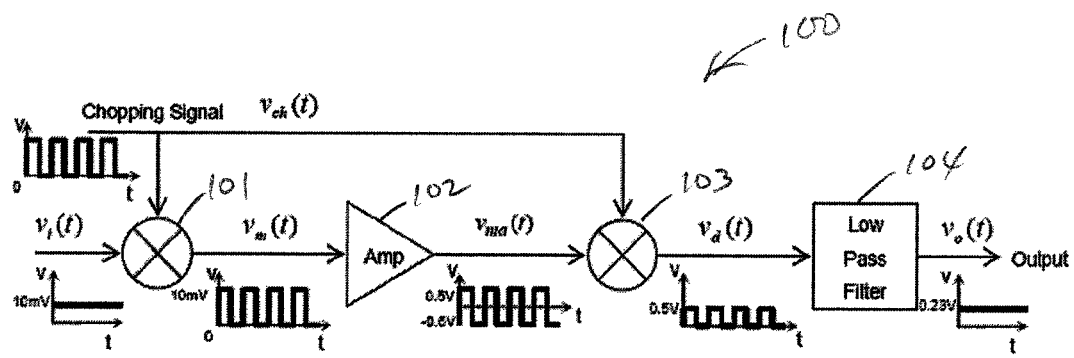
Figure 1: Principle of chopper amplifier
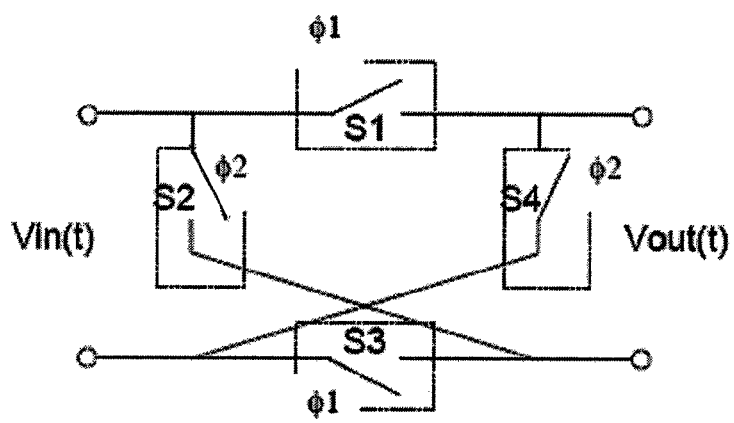
Figure 2

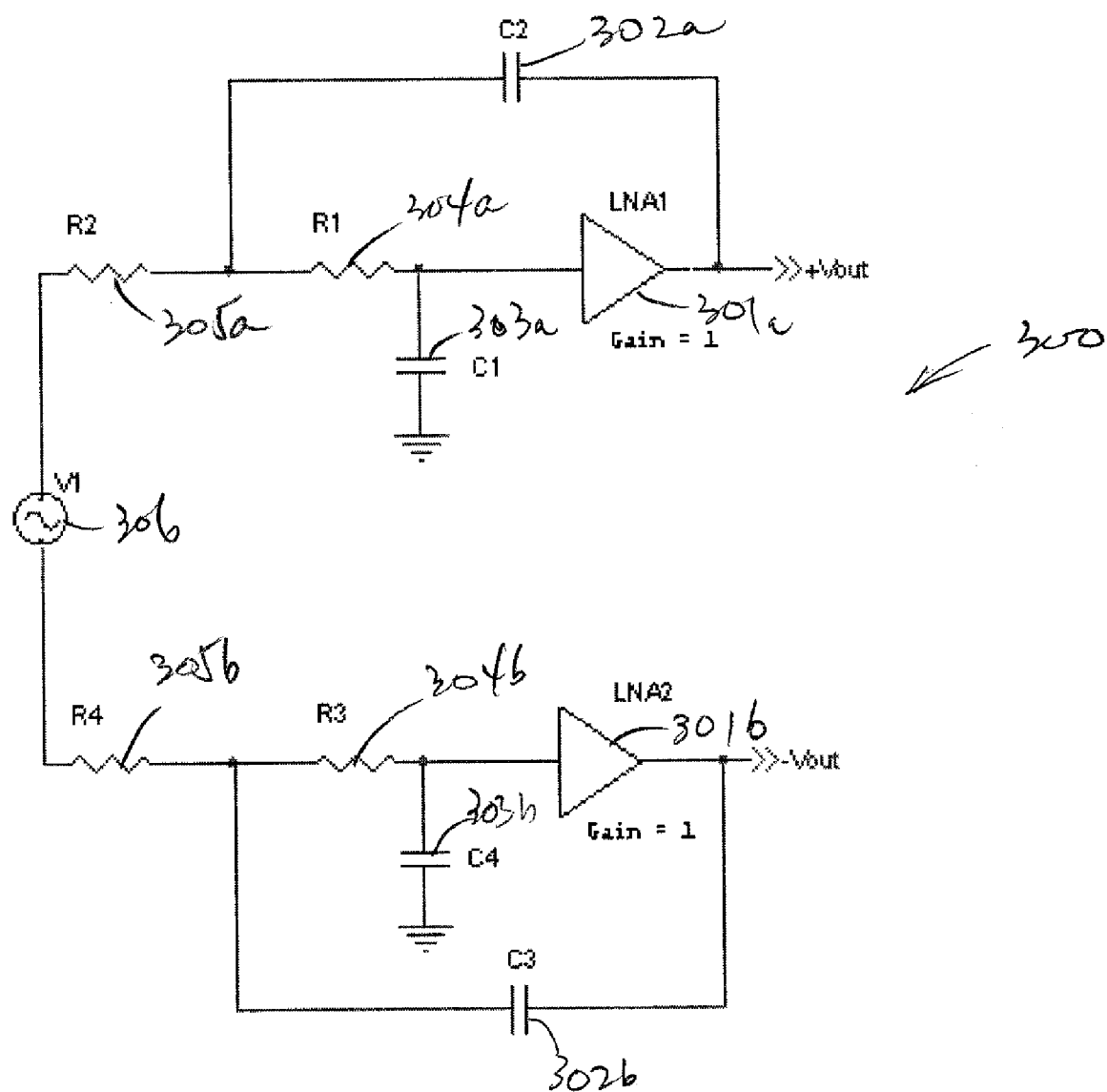
Figure 3 - Balanced Filter

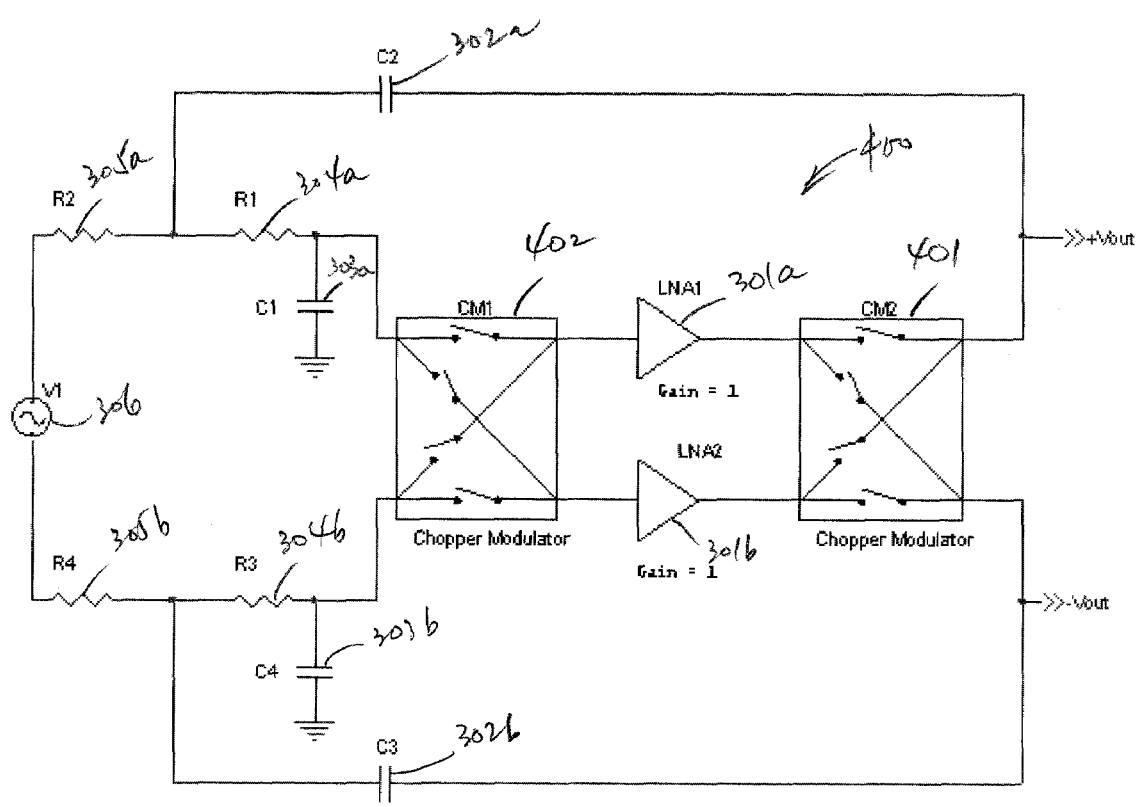
Figure 4- Balanced Filter with Chopping Amplifier

US 7,671,672 B2

BASEBAND NOISE REDUCTION

CROSS-REFERENCE TO RELATED APPLICATIONS

The present application relates to and claims benefit of priority of U.S. provisional patent application, entitled "Baseband Noise Reduction," Ser. No. 60/753,878, filed on Dec. 22, 2005. The provisional patent application is hereby incorporated by reference in its entirety.

BACKGROUND OF THE INVENTION

Field of the Invention

The present invention relates to a design of an electronic circuit. In particular, the present invention relates to using chopper-stabilized amplifiers in active filters to reduce baseband noise.

SUMMARY

According to one embodiment of the present invention, an active circuit includes (a) a first chopper circuit receiving an input signal and a chopping signal having a frequency higher than a base band of the input signal, and providing a modulated input signal; (b) an amplifier that receives the modulated input signal and that provides an amplified signal resulting from amplifying the modulated input signal; and (c) a second chopper circuit that receives the amplified signal and the chopping signal to provide an output signal. The chopping signal has a frequency that may be dynamically adjusted to accommodate changes in impedance or output signal spectrum as a result of the operations of the chopper circuits. The active circuit further includes a low pass filter that receives the output signal and that attenuates components of the output signal above the base band of the input signal. In this manner 1/f noise introduced by the amplifier is eliminated or reduced.

The active circuit of the present invention may be implemented in active filters including multiple feedback filters. Alternatively, the active circuit may be implemented in a pre-amplifier of a base band filter, or as a gain stage prior to a filter with a high impedance input.

The active circuit of the present invention may be implemented in balanced filters that receive a differential signal.

In one embodiment, the active circuit has a chopping frequency greater than 50 MHz. The amplifier may have a unit gain for input signal up to 1 GHz.

The present invention is better understood upon consideration of the detailed description below and the accompanying drawings.

BRIEF DESCRIPTION OF THE DRAWINGS

FIG. 1 illustrates the operation of chopper-stabilized amplifier 100, in accordance to one embodiment of the present invention.

FIG. 2 illustrates chopping circuit 200 suitable for use in chopper-stabilized amplifier 100 of FIG. 1.

FIG. 3 shows conventional balanced filter 300.

FIG. 4 shows balanced filter 400 achieved by introducing chopper circuits 401 and 402 to provide chopper-stabilized amplifiers in balanced filter 300 of FIG. 1, in accordance with one embodiment of the present invention.

To facilitate cross-reference among the figures, like elements in the figures are provided reference numerals.

DETAILED DESCRIPTION OF THE PREFERRED EMBODIMENT

The inventor observed that low-frequency CMOS amplifiers suffer from 1/f noise (i.e., noise that has a spectrum that decreases in magnitude with frequency). The present invention provides a chopper-stabilized amplifier that reduces the 1/f noise in a baseband filter or in a preamplifier for a baseband filter. According to one embodiment of the present invention, 1/f noise introduced in baseband lowpass filters can be reduced by replacing the amplifiers with chopper-stabilized amplifiers.

FIG. 1 illustrates the operation of such a chopper-stabilized amplifier (chopper-stabilized amplifier 100). As shown in FIG. 1, an input signal $v_i(t)$ is modulated at chopper circuit or modulator 101 with a chopping signal $v_{ch}(t)$, which includes a pulse train at a predetermined chopping rate that is substantially higher in frequency than the base band of input signal $v_i(t)$. The resulting signal $v_m(t)$ is provided to amplifier 102, where signal $v_m(t)$ is amplified to provide amplified signal $v_{ma}(t)$. In FIG. 1, amplifier 102 provides a high gain (e.g., 50). Amplified signal $v_{ma}(t)$ is mixed in chopper circuit or modulator 103 with chopping signal $v_{ch}(t)$ to provide output signal $v_d(t)$, Output signal $v_d(t)$ is then filtered using low-pass filter 104, which has a stop band frequency less than the chopping rate of signal $v_{ch}(t)$. In this process, any low-frequency noise introduced by amplifier 102 is up-converted to the chopping frequency and filtered out by low-pass filter 104.

FIG. 2 illustrates in detail chopping circuit 200, which may be used to implement each of chopper circuits 101 and 103. In chopping circuit 200, switches $S_1$ and $S_3$ are controlled by clock signal $\phi_1$ to open and close at the same time. Similarly, switches $S_2$ and $S_4$ are controlled by clock signal $\phi_2$ to open and close at the same time. Clock signals $\phi_1$ and $\phi_2$ are preferably non-overlapping. If amplifier 102 has low distortion, lowpass filter 104 may be implemented by as simply as a capacitor that holds the output voltage when all switches are off.

In one embodiment, chopping circuit 200 may operate at a frequency greater than approximately 50 MHz. It may also be desirable, in some instances, to dynamically set the chopping frequency (i.e., the frequencies of clock signals $\phi_1$ and $\phi_2$), such that harmonics of the chopping frequency are outside of a received signal's spectrum. FIGS. 3 and 4 illustrates applying chopper-stabilized amplifier technique to a balanced filter. FIG. 3 shows a conventional balanced filter 300. As shown in FIG. 3, balanced filter 300 for a differential input signal represented by voltage source 306 includes multiple feedback (MFB) filters implemented by amplifiers 301a, 301b, capacitors 302a, 302b, 303a and 303b and resistors 304a, 304b, 305a and 305b. Such an MFB filter may be used where greater than approximately 1 GHz unity gain bandwidth is used. FIG. 4 shows balanced filter 400 achieved by introducing chopper circuits 401 and 402 to provide chopper-stabilized amplifiers, in accordance with one embodiment of the present invention. Chopper circuits 401 and 402 may each be implemented by, for example, chopper circuit 200 of FIG. 2. Charge holding capacitors (not shown) may be provided at the output terminals of chopper-stabilized balanced filter 400.

In applying the chopper-stabilized amplifier technique, in some cases, for example, where a filter has a high impedance at the amplifier input terminals, low noise performance may be achieved by providing a chopper stabilized gain stage after the mixer and before the filter to set noise performance. Thus, many filter designs are suitable for chopper-stabilization. Chopper-stabilization may be applied also in a baseband preamplifier, in addition to filters. The chopping frequency is preferably dynamically selected, to accommodate any change in performance due to converting an amplifier to a chopper-stabilized implementation, or bandwidth shifting due to the internal impedances changes as the switches change state. Noise introduced at the switching frequency can be reduced further by an additional filter at the output.

The detailed description above is provided to illustrate specific embodiments of the present invention and is not intended to be limiting. Numerous modifications and variations within the scope of the present invention are possible. The present invention is set forth in the following claims.

The invention claimed is:

1. An active circuit, comprising:
a first chopper circuit that receives an input signal and a chopping signal of a frequency higher than a base band of the input signal, and that provides a modulated input signal;
an amplifier that receives the modulated input signal and that provides an amplified signal resulting form amplifying the modulated input signal; and
a second chopper circuit that receives the amplified signal and the chopping signal to provide an output signal; wherein
the first chopper circuit and the second chopper circuit further comprise a first switch and a second switch configured to open and close according to a first clock signal, the first switch and the second switch configured to pass the input signal when the first clock signal is in a first state, the first chopper circuit and the second chopper circuit further comprising a third switch and a fourth switch configured to open and close according to a second clock signal, the third switch and the fourth switch configured to pass an inverted input signal when the second clock signal is in a second state.

2. The active circuit as in claim 1, further comprising a low pass filter that receives the output signal and that attenuates components of the output signal above the base band of the input signal.

3. The active circuit as in claim 2, wherein the low pass filter comprises a holding capacitor.

4. The active circuit as in claim 1, wherein the active circuit comprises an active filter.

5. The active circuit as in claim 1, wherein the active circuit comprises a gain stage upstream from a filter with a high impedance input terminal.

6. The active circuit as in claim 1, wherein the active circuit comprises a pre-amplifier for a base band filter.

7. The active circuit as in claim 1, wherein the active circuit comprises a balanced filter receiving a differential signal.

8. The active circuit as in claim 1, further comprising a filter to attenuate noise at the switching frequency.

9. The active circuit as in claim 1, wherein the frequency of the chopping signal is greater than 50 MHz.

10. The active circuit as in claim 1, wherein the amplifier has a unit gain for input signal up to 1 GHz.

11. The active circuit as in claim 1, wherein the first and second chopping circuit each comprise switches alternatively, according to the chopping signal, inverting and non-inverting its input signal.

12. A method for processing an input signal, comprising the steps of:
chopping the input signal to produce a modulated input signal based upon a chopping signal by providing a first switch and a second switch configured to open and close according to a first clock signal, the first switch and the second switch configured to pass the input signal when the first clock signal is in a first state and providing a third switch and a fourth switch configured to open and close according to a second clock signal, the third switch and the fourth switch configured to pass an inverted input signal when the second clock signal is in a second state, the chopping signal having a frequency higher than a base band of the input signal, the modulated input signal having a frequency substantially similar to the chopping signal;
amplifying the modulated input signal to produce an amplified signal;
chopping the amplified signal to produce an output signal based upon the chopping signal; and
dynamically selecting the frequency of the chopping signal such that harmonics of the chopping signal are outside a spectrum of the input signal.

13. The method of claim 12, further comprising the step of filtering low frequency noise from the output signal.

14. The method of claim 12, further comprising the step of filtering the output signal to attenuate components of the output signal above the base band of the input signal.

15. An active circuit, comprising:
means for chopping an input signal to produce a modulated input signal based upon a chopping signal, the chopping signal having a frequency higher than a base band of the input signal, the modulated input signal having a frequency substantially similar to the chopping signal;
means for amplifying the modulated input signal to produce an amplified signal;
means for chopping the amplified signal to produce an output signal based upon the chopping signal; and
means for dynamically selecting the frequency of the chopping signal such that harmonics of the chopping signal are outside a spectrum of the input signal; wherein
the chopping means further comprises a first switching means and a second switching means configured to open and close according to a first clock signal, the first switching means and the second switching means configured to pass the input signal when the first clock signal is in a first state, the chopping means further comprising a third switching means and a fourth switching means configured to open and close according to a second clock signal, the third switch and the fourth switch configured to pass an inverted input signal when the second clock signal is in a second state.

16. The active circuit of claim 15, further comprising means for filtering low frequency noise from the output signal.

17. The active circuit of claim 15, further comprising means for filtering the output signal to attenuate components of the output signal above the base band of the input signal.

* * * * *